(12) United States Patent
Chang

(10) Patent No.: US 9,305,611 B2
(45) Date of Patent: Apr. 5, 2016

(54) SENSE AMPLIFIER FOR A MEMORY CELL WITH A FAST SENSING SPEED

(71) Applicant: eMemory Technology Inc., Hsin-Chu (TW)

(72) Inventor: Che-Wei Chang, Hsinchu County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/736,271

(22) Filed: Jun. 11, 2015

(65) Prior Publication Data

US 2016/0005486 A1 Jan. 7, 2016

Related U.S. Application Data

(60) Provisional application No. 62/021,216, filed on Jul. 7, 2014.

(51) Int. Cl.
| | |
|---|---|
| *G11C 7/06* | (2006.01) |
| *G11C 5/14* | (2006.01) |
| *G11C 16/30* | (2006.01) |
| *G11C 16/14* | (2006.01) |
| *H02M 3/07* | (2006.01) |
| *G11C 16/28* | (2006.01) |
| *H02M 1/14* | (2006.01) |
| *H03K 17/687* | (2006.01) |

(52) U.S. Cl.
CPC ............ *G11C 5/145* (2013.01); *G11C 16/14* (2013.01); *G11C 16/28* (2013.01); *G11C 16/30* (2013.01); *H02M 1/14* (2013.01); *H02M 3/07* (2013.01); *H03K 17/687* (2013.01)

(58) Field of Classification Search
CPC .......... G11C 7/062; G11C 7/065; G11C 7/06; G11C 7/02; G11C 7/1057; G11C 7/106; G11C 7/1051; G11C 7/14; G11C 11/1673; G11C 11/2273; G11C 11/4091; G11C 11/4099; G11C 11/419; G11C 13/004; G11C 16/28; G11C 16/26; G11C 2013/0045; G11C 2207/063; G11C 2211/5645
See application file for complete search history.

(56) References Cited

U.S. PATENT DOCUMENTS

| | | | |
|---|---|---|---|
| 6,707,717 B2 * | 3/2004 | Jun-Lin ................. | G11C 7/062 365/185.2 |
| 8,254,178 B2 | 8/2012 | Kern | |
| 8,947,924 B2 * | 2/2015 | Li ...................... | G11C 13/0004 365/163 |

* cited by examiner

*Primary Examiner* — Andrew Q Tran
(74) *Attorney, Agent, or Firm* — Winston Hsu; Scott Margo

(57) ABSTRACT

A sense amplifier comprises a cell current generator, a reference current generator, a first and a second charge/discharge elements, a first and a second voltage trigger circuits, and a data holder. The cell current generator is used to output a cell current of a memory cell. The reference current generator is used to output a duplicated reference current. The first and the second charge/discharge elements are used to convert the cell current and the duplicated reference current to voltage signals respectively. The first voltage trigger circuit is used to output a data signal according to a voltage signal outputted from the first charge/discharge element. The second voltage trigger circuit is used to output a hold control signal according to a voltage signal outputted from the second charge/discharge element. The data holder is used to hold a voltage level of the data signal according to the hold control signal.

25 Claims, 5 Drawing Sheets

SENSE AMPLIFIER FOR A MEMORY CELL WITH A FAST SENSING SPEED

CROSS REFERENCE TO RELATED APPLICATIONS

This non-provisional application claims priority of U.S. provisional application US 62/021,216, filed on Jul. 7, 2014, included herein by reference in its entirety.

BACKGROUND OF THE INVENTION

1. Field of the Invention

The invention relates to a sense amplifier for a memory cell, and more particularly, a sense amplifier for a memory cell that has a fast sensing speed.

2. Description of the Prior Art

One common way to determine the bit data stored in a memory cell is to compare a cell current of the memory cell with a reference current. For example, if the cell current of the memory cell is greater than the reference current, the bit stored in the memory cell may be determined to be 0. If the cell current of the memory cell is smaller than the reference current, the bit stored in the memory cell may be determined to be 1.

FIG. 1 shows a sense amplifier 100 according to prior art. The sense amplifier 100 includes a cell current generator 110, a reference current generator 120, and an output buffer 130. The cell current generator 110 is coupled to a memory cell 10 and the cell current generator 110 is used to generate a cell current $I_{cell}$ according to the current outputted from the memory cell 10. The reference current generator 120 is used to generate a reference current $I_{ref}$. The output buffer 130 is coupled to a node N1. The node N1 is coupled to both the cell current generator 110 and the reference current generator 120. When using the sense amplifier 100 to determine the bit data, the cell current generator 110 can output the cell current $I_{cell}$ going into the node N1 and the reference current generator 120 can output the reference current $I_{ref}$ going out of the node N1. Consequently, when the cell current $I_{cell}$ is greater than the reference current $I_{ref}$, the voltage level of the node N1 will be raised up to a higher voltage level by the cell current generator 110, and when the cell current $I_{cell}$ is smaller than the reference current $I_{ref}$, the voltage level of the node N1 will be pull down to a lower voltage level by the reference current generator 120.

According to the sense amplifier 100, the bit data stored in the memory cell 10 can be determined when the cell current $I_{cell}$ or the reference current $I_{ref}$ finally causes the voltage level of the node N1 to be greater or lower than a threshold value. Namely, the time required for determining the bit data is significantly dependent on the difference between the cell current $I_{cell}$ and the reference current $I_{ref}$. For example, if the cell current $I_{cell}$ is only slightly greater than the reference current $I_{ref}$, it will take much more time for the cell current generator 110 to raise the voltage level of the node N1 to be greater than the threshold value before one can certainly determine the bit data, which is very inefficient for determining the bit data. Thus, how to reduce the time of determining the bit data while stabilizing the time to determine the bit data has become a critical issue to be solved.

SUMMARY OF THE INVENTION

One embodiment of the present application discloses a sense amplifier. The sense amplifier comprises a cell current generator, a reference current generator, a first charge/discharge element, a second charge/discharge element, a first voltage trigger circuit, a second voltage trigger circuit, and a data holder. The cell current generator is coupled to a memory cell, and is configured to receive a cell current outputted from the memory cell and configured to output a duplicated cell current accordingly. The reference current generator is configured to generate a duplicated reference current. The first charge/discharge element is coupled to the cell current generator. The first charge/discharge element is configured to receive a system ground voltage and a system reference voltage, to be charged or discharged to the system reference voltage, and to be discharged or charged by the duplicated cell current from the system reference voltage. The second charge/discharge element is coupled to the reference current generator. The second charge/discharge element is configured to receive the system ground voltage and the system reference voltage, to be charged or discharged to the system reference voltage, and to be discharged or charged by the duplicated reference current from the system reference voltage. The first voltage trigger circuit has an input terminal coupled to the second terminal of the first charge/discharge element, and an output terminal for outputting a data signal. The second voltage trigger circuit has an input terminal coupled to the second terminal of the second charge/discharge element, and an output terminal for outputting a hold control signal. The data holder is coupled to the output terminal of the first voltage trigger circuit and the output terminal of the second voltage trigger circuit. The data holder is configured to hold a voltage level of the data signal when the hold control signal changes from a first voltage level to a second voltage level.

Another embodiment of the present invention discloses a sensing amplifier with a self-trigger latch. The sensing amplifier comprises a cell current generator, a reference current generator, a first charge/discharge element, a second charge/discharge element, a first voltage trigger circuit, a second voltage trigger circuit, and a data holder. The cell current generator is coupled to a memory cell. The cell current generator is configured to receive a cell current outputted from the memory cell and configured to output a duplicated cell current accordingly. The reference current generator is configured to generate a duplicated reference current. The first charge/discharge element is coupled to the cell current generator. The first charge/discharge element is configured to receive a system ground voltage and a system reference voltage, to be charged or discharged to the system reference voltage during a first period, and to be discharged or charged by the duplicated cell current from the system reference voltage during a second period. The second charge/discharge element is coupled to the reference current generator. The second charge/discharge element is configured to receive the system ground voltage and the system reference voltage, to be charged or discharged to the system reference voltage during the first period, and to be discharged or charged by the duplicated reference current from the system reference voltage during the second period. The first voltage trigger circuit is coupled to the first charge/discharge element to be triggered by a voltage level of the first charge/discharge element for outputting a data signal during the second period. The second voltage trigger circuit is coupled to the second charge/discharge element to be triggered by a voltage level of the second charge/discharge element for outputting a hold control signal during the second period. The data holder is coupled to the first voltage trigger circuit and the second voltage trigger circuit for outputting an output signal which indicating a bit data stored in the memory cell according to the data signal and the hold control. The first charge/discharge element and the second charge/discharge element have capacitors of substantially same capacitance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
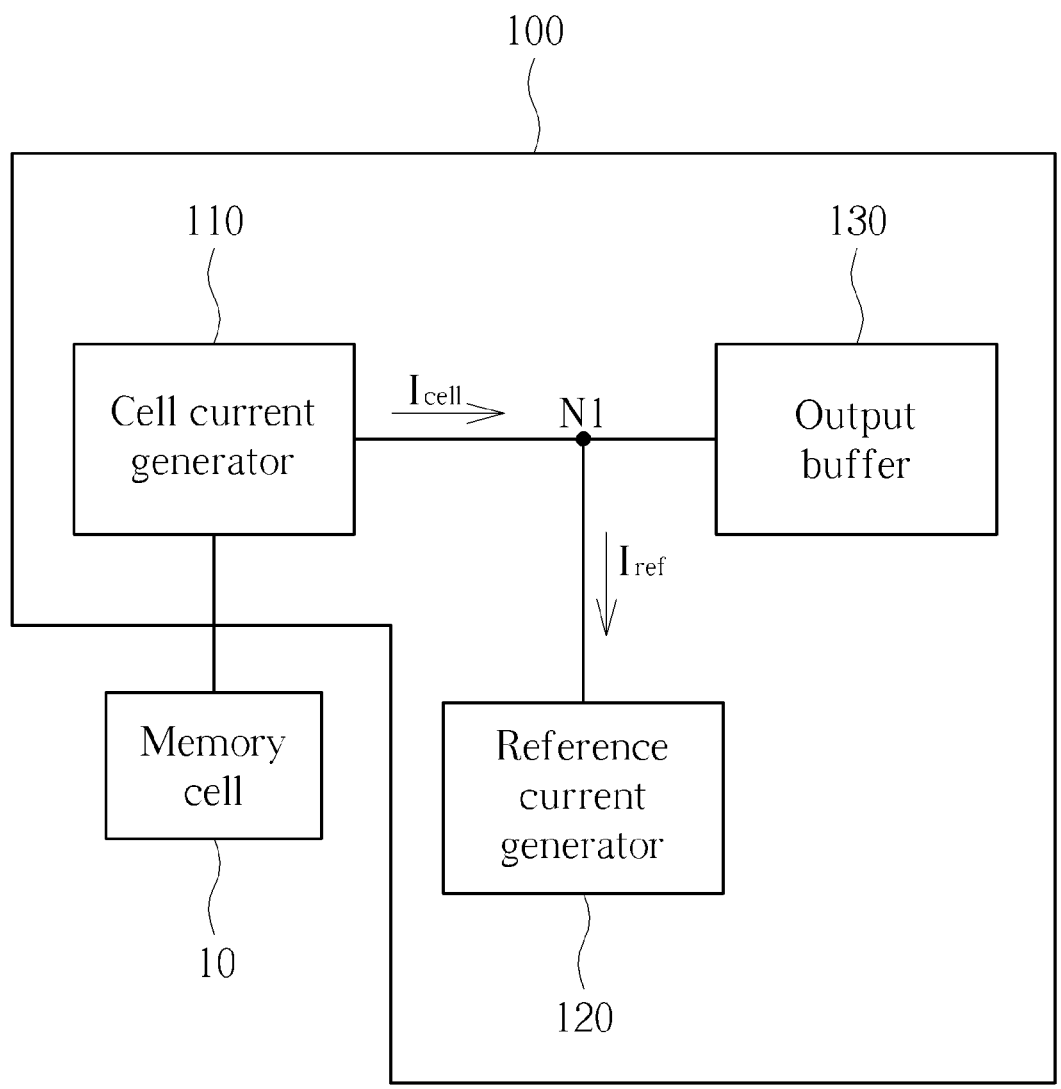
FIG. 1 shows a sense amplifier according to prior art.
Figure 2:
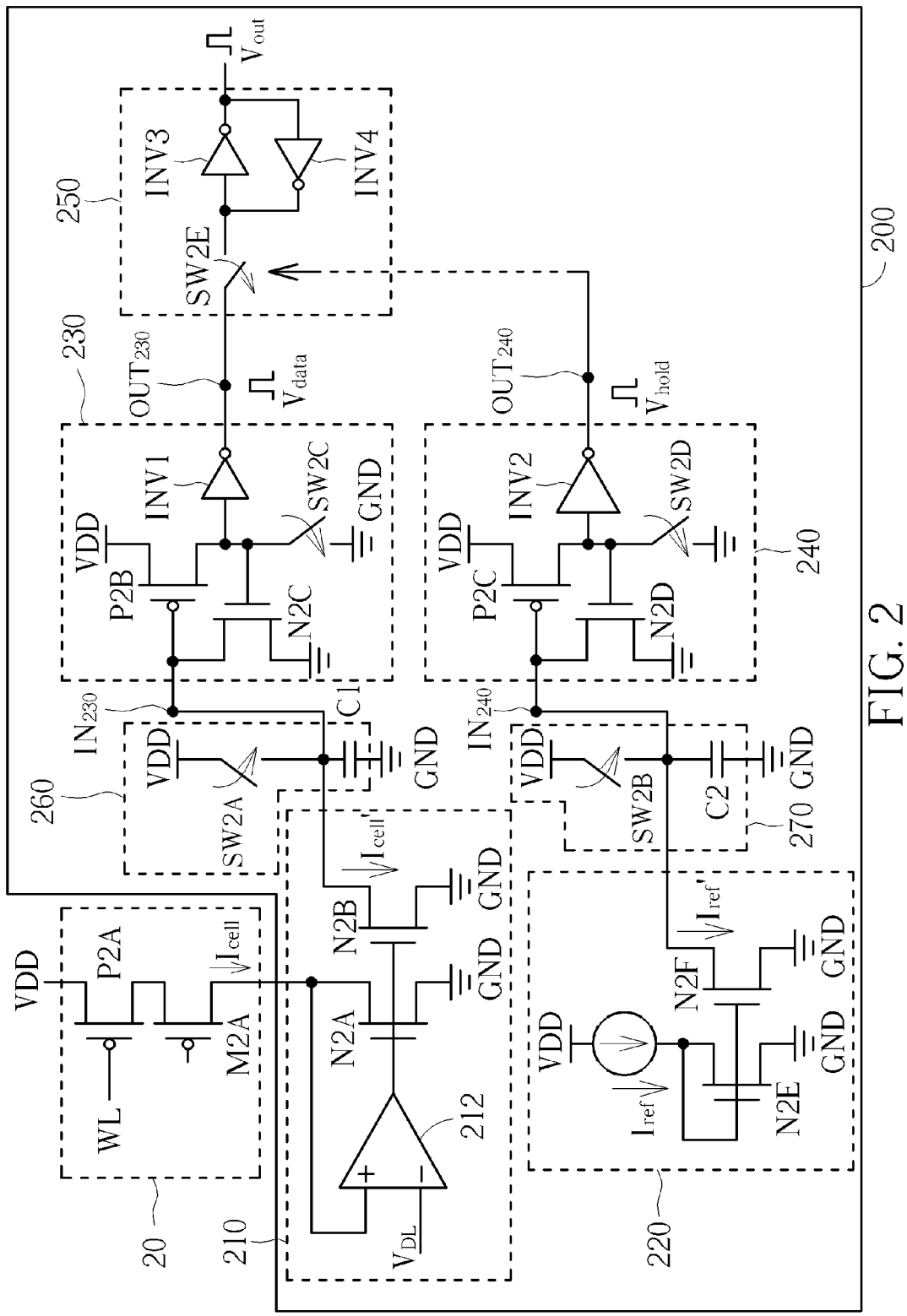
FIG. 2 shows a sense amplifier according to one embodiment of the present invention.

FIG. 2 shows a sense amplifier 200 according to one embodiment of the present invention. The sense amplifier 200 includes a cell current generator 210, a reference current generator 220, a first voltage trigger circuit 230, a second voltage trigger circuit 240, a data holder 250, a first charge/discharge element 260, and a second charge/discharge element 270.

As shown in FIG. 2, a memory cell 20 coupled to the sense amplifier 200 can be composed of PMOSFETs (P-channel metal-oxide-semiconductor field-effect transistor) and the cell current will be outputted into the cell current generator 210. For example, the memory cell 20 can include a first PMOSFET P2A and a memory transistor M2A. The first PMOSFET P2A can have a first terminal configured to receive a system high voltage VDD, a second terminal, and a control terminal coupled to a word line WL. The memory transistor M2A can have a first terminal coupled to the second terminal of the first PMOSFET P2A, a floating gate terminal, and a second terminal coupled to the cell current generator 210. When reading the bit data from the memory transistor M2A, the first PMOSFET P2A can be turned on by the word line WL, and the cell current $I_{cell}$ of the memory cell 20 can be outputted into the cell current generator 210. However, the sense amplifier 200 of the present invention is not limited to be coupled to the memory cell 20. In other embodiments of the present invention, the sense amplifier 200 can also apply to other kinds of the memory cell.

The cell current generator 210 is coupled to a memory cell 20. The cell current generator 210 can be configured to receive a cell current $I_{cell}$ outputted from the memory cell 20 and to output a duplicated cell current $I_{cell'}$ accordingly. In FIG. 2, the cell current generator 210 can include an amplifier 212, and first NMOSFET (N-channel metal-oxide-semiconductor field effect transistors) N2A and a second NMOSFET N2B. The amplifier 212 can have a positive terminal coupled to the second terminal of the memory transistor M2A, a negative terminal configured to receive a bias voltage $V_{DL}$ of the memory cell 20, and an output terminal. The bias voltage $V_{DL}$ can be a parameter of the memory cell 20 for adjusting the proper amount of cell current. The first NMOSFET N2A can have a first terminal coupled to the positive terminal of the amplifier 212, a second terminal configured to receive the system ground voltage GND, and a control terminal coupled to the output terminal of the amplifier 212. The second NMOSFET N2B can have a first terminal coupled to the first terminal of the first capacitor C1, a second terminal configured to receive the system ground voltage GND, and a control terminal coupled to the control terminal of the first NMOSFET N2A. Since the control terminals of the NMOSFETs N2A and N2B are configured to receive the same voltage and the second terminals of the NMOSFETs N2A and N2B are configured to receive the same voltage, the cell current generator 210 is able to generate the duplicated cell current $I_{cell'}$ according to the cell current $I_{cell}$.

The first charge/discharge element 260 can include a first switch SW2A and a first capacitor C1. The first switch SW2A can have a first terminal configured to receive a system reference voltage, and a second terminal coupled to the cell current generator 210. In some embodiments of the present invention, the system reference voltage can be higher than the system ground voltage. For example, the system reference voltage can be the system high voltage VDD. The first capacitor C1 can have a first terminal coupled to the second terminal of the first switch SW2A, and a second terminal configured to receive a system ground voltage GND. In this case, the first capacitor C1 of the first charge/discharge element 260 can be charged to the system reference voltage when the first switch SW2A is turned on, and the first capacitor C1 of the first charge/discharge element 260 can be discharged by the duplicated cell current $I_{cell'}$ from the system reference voltage when the first switch SW2A is turned off.

The second charge/discharge element 270 can include a second switch SW2B and a second capacitor C2. The second switch SW2B can have a first terminal configured to receive the system reference voltage, and a second terminal coupled to the reference current generator 220. The second capacitor C2 can have a first terminal coupled to the second terminal of the second switch SW2B, and a second terminal configured to receive the system ground voltage GND. Therefore, the second capacitor C2 of the second charge/discharge element 270 can be charged to the system reference voltage when the second switch SW2B is turned on, and the second capacitor C2 of the second charge/discharge element 270 can be discharged by a duplicated reference current $I_{ref'}$ generated by the reference current generator 220 from the system reference voltage when the second switch SW2B is turned off.

It is to be noted that the first capacitor C1 and the second capacitor C2 can have the substantially same capacitance.

The reference current generator 220 can be configured to generate the duplicated reference current $I_{ref'}$. The reference current generator 220 may include fifth and sixth NMOSFETs N2E and N2F. The fifth NMOSFET N2E can have a first terminal configured to receive a reference current $I_{ref}$, a second terminal configured to receive the system ground voltage GND, and a control terminal coupled to the first terminal of the fifth NMOSFET N2E. The sixth NMOSFET N2F can have a first terminal coupled to the first terminal of the second capacitor C2 for outputting the duplicated reference current $I_{ref'}$, a second terminal configured to receive the system ground voltage GND, and a control terminal coupled to the control terminal of the fifth NMOSFET N2E. Since the control terminals of the NMOSFETs N2E and N2F are configured to receive the same voltage and the second terminals of the NMOSFETs N2E and N2F are configured to receive the same voltage, the reference current generator 220 is able to generate the duplicated reference current $I_{ref}$ according to the reference current $I_{ref}$.

In FIG. 2, the first voltage trigger circuit 230 can have an input terminal $IN_{230}$ coupled to the second terminal of the first switch SW2A of the first charge/discharge element 260, and an output terminal $OUT_{230}$ for outputting the data signal $V_{data}$. The second voltage trigger circuit 240 can have an input terminal $IN_{240}$ coupled to the second terminal of the second switch SW2B of the second charge/discharge element 270, and an output terminal $OUT_{240}$ for outputting the hold control signal $V_{hold}$. The data holder 250 can be coupled to the output terminal $OUT_{230}$ of the first voltage trigger circuit 230 and the output terminal $OUT_{240}$ of the second voltage trigger circuit 240. The data holder 250 can be configured to hold a voltage level of the data signal $V_{data}$ when the hold control signal $V_{hold}$ changes from the first voltage level to the second voltage level, for example, when the hold control signal $V_{hold}$ changes from the system high voltage VDD to the system ground voltage GND. In some embodiments of the present invention, the first voltage trigger circuit 230 can include a third switch SW2C, a second PMOSFET P2B, a third NMOSFET N2C, and a first inverter INV1. The third switch SW2C can have a first terminal configured to receive the system ground voltage GND, and a second terminal. The second PMOSFET P2B can have a first terminal configured to receive the system high voltage VDD, a second terminal coupled to the second terminal of the third switch SW2C, and a control terminal coupled to the input terminal $IN_{230}$ of the first voltage trigger circuit 230. The third NMOSFET N2C can have a first terminal coupled to the control terminal of the second PMOSFET P2B, a second terminal configured to receive the system ground voltage GND, and a control terminal coupled to the second terminal of second the PMOSFET P2B. The first inverter INV1 can have an input terminal coupled to the second terminal of the second PMOSFET P2B and an output terminal coupled to the output terminal $OUT_{230}$ of the first voltage trigger circuit 230.

In some embodiments of the present invention, the second voltage trigger circuit 240 can include a fourth switch SW2D, a third PMOSFET P2C, a fourth NMOSFET N2D, and a second inverter INV2. The fourth switch SW2D can have a first terminal configured to receive the system ground voltage GND, and a second terminal. The third PMOSFET P2C can have a first terminal configured to receive the system high voltage VDD, a second terminal coupled to the second terminal of the fourth switch SW2D, and a control terminal coupled to the input terminal $IN_{240}$ of the second voltage trigger circuit 240. The fourth NMOSFET N2D can have a first terminal coupled to the control terminal of the third PMOSFET P2C, a second terminal configured to receive the system ground voltage GND, and a control terminal coupled to the second terminal of the third PMOSFET P2C. The second inverter INV2 can have an input terminal coupled to the second terminal of the third PMOSFET P2C and an output terminal coupled to the output terminal $OUT_{240}$ of the second voltage trigger circuit 240.

The data holder 250 can include a fifth switch SW2E, a third inverter INV3 and a fourth inverter INV4. The fifth switch SW2E can have a first terminal coupled to the output terminal $OUT_{230}$ of the first voltage trigger circuit 230, a second terminal, and a control terminal coupled to output terminal $OUT_{240}$ of the second voltage trigger circuit 240. The fifth switch SW2E can be turned on when the first and second switches SW2A and SW2B are turned on, and can be turned off when the hold control signal $V_{hold}$ changes from the first voltage level to the second voltage level, for example, when the hold control signal $V_{hold}$ changes from the system high voltage VDD to the system ground voltage GND, the fifth switch SW2E will be turned off. The third inverter INV3 can have an input terminal coupled to the second terminal of the fifth switch SW2E, and an output terminal. The fourth inverter INV4 can have an input terminal coupled to the output terminal of the third inverter INV3, and an output terminal coupled to the input terminal of the third inverter INV3.

Figure 3:
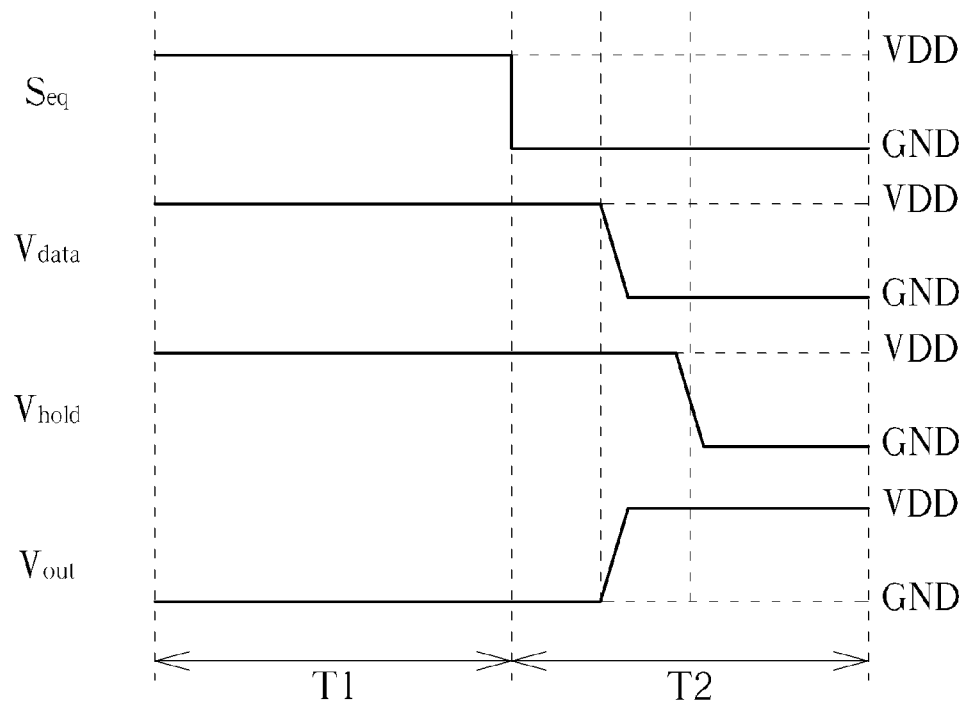
FIG. 3 shows a timing diagram for the sense amplifier in FIG. 2 according to one embodiment of the present invention.

It is to be noted that the switches SW2A, SW2B, SW2C, and SW2D can be turned on simultaneously and turned off simultaneously. In some embodiments, the switches SW2A, SW2B, SW2C, and SW2D are controlled by the same signal. To be even more specific, FIG. 3 shows a timing diagram of the sense amplifier 200 sensing the bit data "0" according to one embodiment of the present invention. In FIG. 3, the switches SW2A, SW2B, SW2C, and SW2D are controlled by a signal $S_{eq}$. When the signal $S_{eq}$ is at a high voltage level, ex., the system high voltage VDD, the switches SW2A, SW2B, SW2C, and SW2D are turned on, and when the signal $S_{eq}$ is at a low voltage level, ex., the system ground voltage GND, the switches SW2A, SW2B, SW2C, and SW2D are turned off. However, the present invention is not limit to control the switches SW2A, SW2B, SW2C, and SW2D by the signal $S_{eq}$.

In FIG. 3, during the first period T1, the signal $S_{eq}$ is at the system high voltage VDD so the switches SW2A, SW2B, SW2C, and SW2D are turned on. The first and second capacitors C1 and C2 are charged so the voltage levels of the first terminals of the first and second capacitors C1 and C2 are pulled up to the system high voltage VDD. The fifth switch SW2E is also turned on during the first period T1. The second and third PMOSFETs P2B and P2C and the third and fourth NMOSFETs N2C and N2D are all turned off. The data signal $V_{data}$ is at the system high voltage VDD and the hold control signal $V_{hold}$ is also at the system high voltage VDD. Thus, the output signal $V_{out}$ of the sense amplifier 200, namely the voltage level of the output terminal of the inverter INV3, is at the system ground voltage GND.

During the second period T2, the signal $S_{eq}$ is at the system ground voltage GND so the switches SW2A, SW2B, SW2C, and SW2D are turned off. The first and second capacitors C1 and C2 are discharged by the duplicated cell current $I_{cell'}$ and the duplicated reference current $I_{ref'}$ respectively. Thus, the voltage levels of the first terminals of the first and second capacitors C1 and C2 are dropped simultaneously but with different speeds.

Since the duplicated current $I_{cell'}$ is greater than the duplicated reference current $I_{ref'}$ when sensing the bit data "0" of the memory cell, the voltage level of the first terminal of the first capacitor C1 drops and reaches a turn-on voltage of the second PMOSFET P2B firstly, the second PMOSFET P2B will be turned on. The turned on second PMOSFET P2B will soon turn on the third NMOSFET N2C as well so the data signal $V_{data}$ will be changed to system ground voltage GND right after. Namely, when the fifth switch SW2E is turned on, the voltage level of the data signal $V_{data}$ is at the system ground voltage GND so the voltage level of the output signal $V_{out}$ of the sense amplifier 200 is at the system high voltage VDD.

After that, when the voltage level of the first terminal of the second capacitor C2 drops and reaches a turn-on voltage of the PMOSFET P2C, the PMOSFET P2C will be turned on. The turned on PMOSFET P2C will soon turn on the NMOSFET N2D as well so the hold control signal $V_{hold}$ will be changed to system ground voltage GND right after. Namely, when the switch SW2E is turned off, the voltage level of the data signal $V_{data}$ is latched by the data holder 250 as the system ground voltage GND so the output signal $V_{out}$ of the sense amplifier 200 is latched at the system high voltage VDD.

It is to be noted that the turn-on voltage of the second PMOSFET P2B can be VDD−$V_{P2B\text{-}TH}$, where $V_{P2B\text{-}TH}$ denotes for the threshold voltage of the second PMOSFET P2B and the turn-on voltage of the third PMOSFET P2C can be VDD−$V_{P2C\text{-}TH}$, where $V_{P2C\text{-}TH}$ denotes for the threshold voltage of the third PMOSFET P2C.

Figure 4:
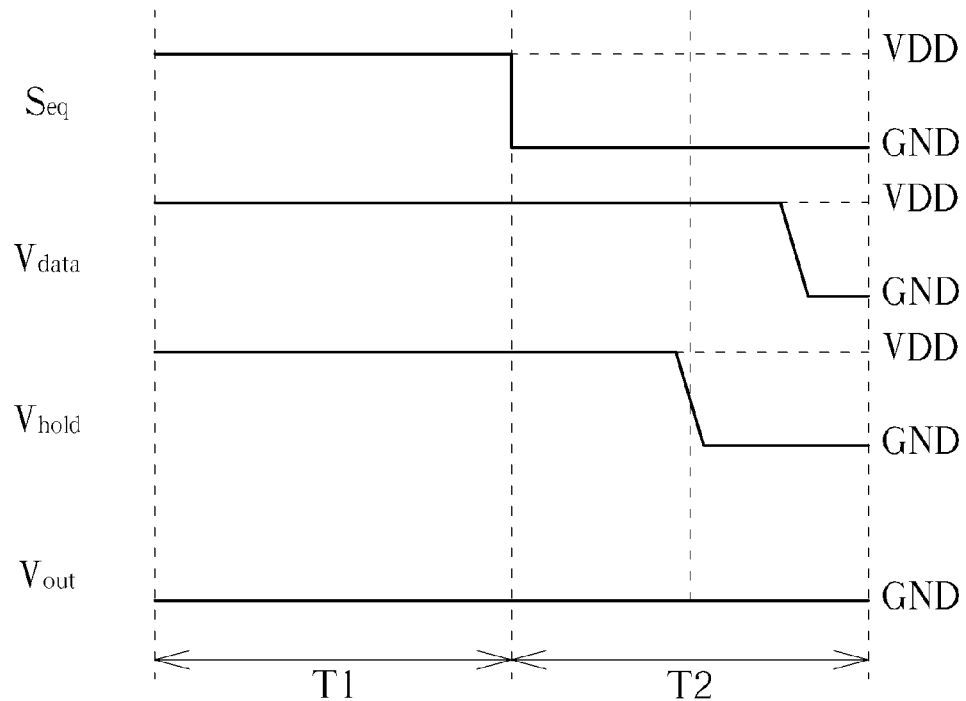
FIG. 4 shows a timing diagram for the sense amplifier in FIG. 2 according to another embodiment of the present invention.

FIG. 4 shows a timing diagram of the sense amplifier 200 sensing the bit data "1" according to another embodiment of the present invention. In FIG. 4, the same operations are applied to the sense amplifier 200 but the duplicated cell current $I_{cell'}$ is smaller than the duplicated reference current $I_{ref'}$ so the hold control signal $V_{hold}$ will be changed to system ground voltage GND before the data signal $V_{data}$ is changed to the system ground voltage GND. Therefore, the voltage level of the data signal $V_{data}$ is latched by the data holder 250 as the system high voltage VDD before the data signal $V_{data}$ changes so that the voltage level of the output signal $V_{out}$ of the sense amplifier 200 is at the system ground voltage GND.

In summary, the first switch SW2A and the second switch SW2B can be configured to be turned on during a first period T1 and be turned off during a second period T2. That is to say, when the first switch SW2A and the second switch SW2B are turned on during the first period T1, the first capacitor C1 and the second capacitor C2 are charged by the system high voltage VDD. When the first switch SW2A and the second switch SW2B are turned off during the second period T2, the first capacitor C1 and the second capacitor C2 can be discharged by the duplicated cell current $I_{cell'}$ and the duplicated reference current $I_{ref'}$ respectively. The first voltage trigger circuit 230 coupled to the first capacitor C1 is triggered by a voltage level of the first capacitor C1 for outputting a data signal $V_{data}$, while the second voltage trigger circuit 240 coupled to the second capacitor C2 is triggered by a voltage level of the second capacitor C2 for outputting a hold control signal $V_{hold}$. The data holder 250 can be coupled to the first voltage trigger circuit 230 and the second voltage trigger circuit 240 for outputting an output signal $V_{out}$ for indicating a bit data stored in the memory cell 20 according to the data signal $V_{data}$ and the hold control signal $V_{hold}$. In other words, since the duplicated cell current $I_{cell'}$ may be greater or smaller than the duplicated reference current $I_{ref'}$ according to the bit data stored in the memory cell 20, the data signal $V_{data}$ may change from a first voltage level to a second voltage level before or after the hold control signal $V_{hold}$ change from the first voltage level to the second voltage level during the second period T2. The data holder 250 can output the output signal $V_{out}$ according to the data signal $V_{data}$ latched when the hold control signal $V_{hold}$ changes from the first voltage level to the second voltage level. Consequently, the state of the memory cell 20 can be determined according to the output signal $V_{out}$.

By checking the voltage level of the output signal $V_{out}$ of the sense amplifier 200, the comparing result between the cell current and the reference current is known; therefore, the bit data stored in the memory cell 20 can be determined according to the output signal $V_{out}$ of the sense amplifier 200. Furthermore, the time required for determining the bit data of the memory cell 20 will mostly depend on the time for the duplicated cell current $I_{cell'}$ to discharge the first capacitor C1 before turning on the second PMOSFET P2B of the voltage trigger circuit 230, but independent from the differences between the cell current $I_{cell}$ and the reference current $I_{ref}$. In addition, by selecting a proper capacitor value for the capacitors C1 and C2, the sense amplifier 200 can have an even faster sensing speed.

Although the memory cell 20 is controlled by first PMOSFET P2A, the sense amplifier of the present invention is not limited to be applied with a memory cell controlled by PMOSFET. In other embodiments of the present invention, the sense amplifier may be coupled to memory cells controlled by NMOSFET.

Figure 5:
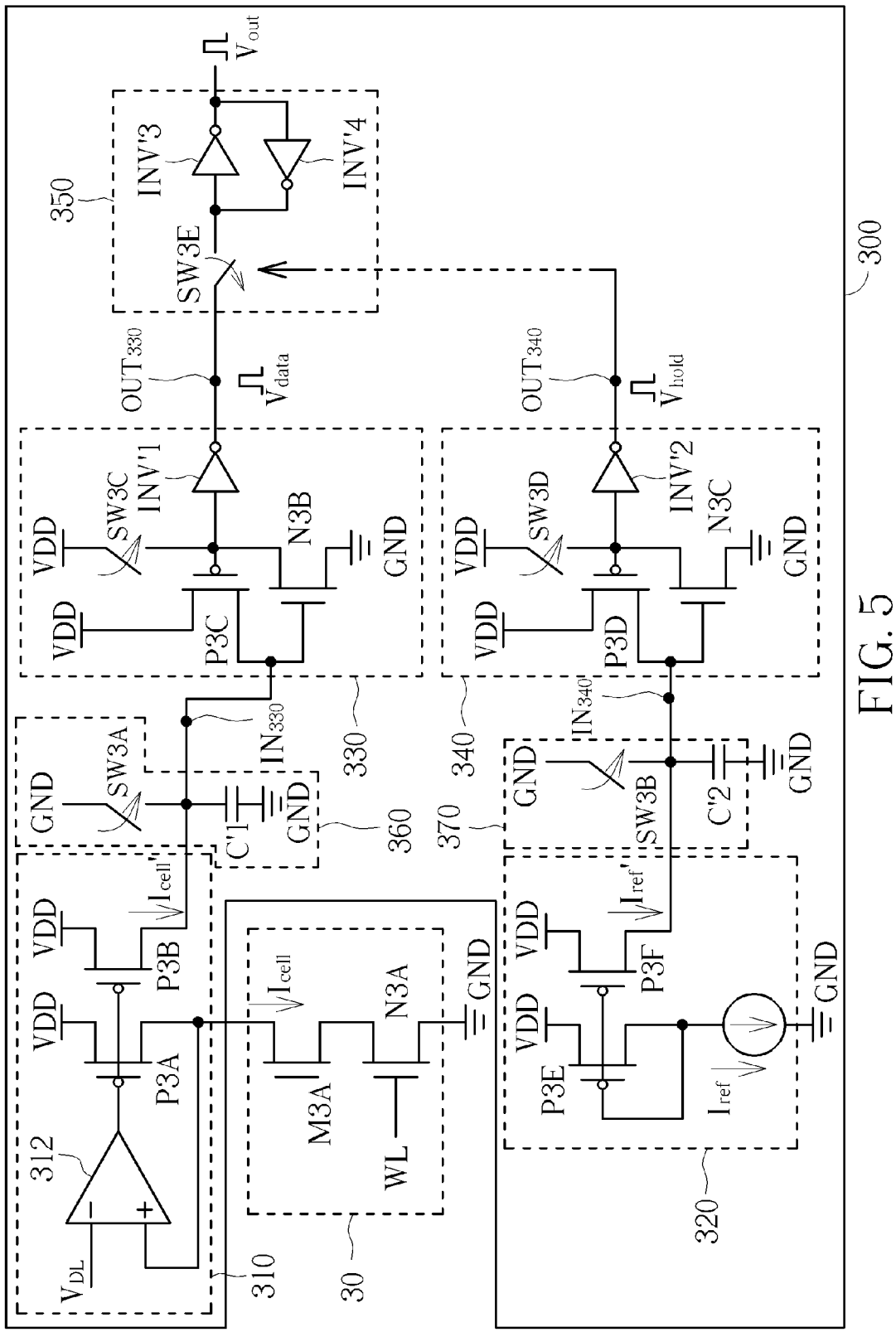
FIG. 5 shows a sense amplifier according to one embodiment of the present invention.

FIG. 5 shows a sense amplifier 300 according to one embodiment of the present invention. The sense amplifier 300 includes a cell current generator 310, a reference current generator 320, a first voltage trigger circuit 330, a second voltage trigger circuit 340, a data holder 350, a first charge/discharge element 360, and a second charge/discharge element 370.

In FIG. 5, the memory cell 30 coupled to the cell current generator 310 can be controlled by an NMOSFET and the cell current has a direction going out of the cell current generator 310. The memory cell 30 can include a first NMOSFET N3A and a memory transistor M3A. The first NMOSFET N3A can have a first terminal, a second terminal configured to receive the system ground voltage GND, and a control terminal coupled to a word line WL. The memory transistor M3A can have a first terminal coupled to the cell current generator 310, a floating gate terminal, and a second terminal coupled to the first terminal of the first NMOSFET N3A. When reading the bit data from the memory transistor M3A, the first NMOSFET N3A can be turned on by the word line WL, and the cell current $I_{cell}$ of the memory cell will be outputted. However, the sense amplifier 300 of the present invention is not limited to be coupled to the memory cell 30. In other embodiments of the present invention, the sense amplifier 300 can also be coupled to other kinds of the memory cell.

The cell current generator 310 is coupled to a memory cell 30. The cell current generator 310 can be configured to receive a cell current $I_{cell}$ outputted from the memory cell 30 and to output a duplicated cell current $I_{cell'}$ accordingly. The cell current generator 310 may include an amplifier 312, a first PMOSFET P3A and a second PMOSFET P3B. The amplifier 312 can have a positive terminal coupled to the first terminal of the memory transistor M3A, a negative terminal configured to receive a bias voltage $V_{DL}$ of the memory cell 30, and an output terminal. The first PMOSFET P3A can have a first terminal configured to receive the system high voltage VDD, a second terminal coupled to the positive terminal of the amplifier 312, and a control terminal coupled to the output terminal of the amplifier 312. The second PMOSFET P3B can have a first terminal configured to receive the system high voltage VDD, a second terminal coupled to the first terminal of the first capacitor C'1, and a control terminal coupled to the control terminal of the first PMOSFET P3A.

The first charge/discharge element 360 can include a first switch SW3A and a first capacitor C'1. The first switch SW3A can have a first terminal configured to receive a system reference voltage, and a second terminal coupled to the cell current generator 310. In some embodiments of the present invention, the system reference voltage can be equal to the system ground voltage GND. The first capacitor C'1 can have a first terminal coupled to the second terminal of the first switch SW3A, and a second terminal configured to receive a system ground voltage GND. In this case, the first capacitor C'1 of the first charge/discharge element 360 can be discharged to the system reference voltage when the first switch SW3A is turned on, and the first capacitor C'1 of the first charge/discharge element 360 can be charged by the duplicated cell current $I_{cell'}$ from the system reference voltage when the first switch SW2A is turned off.

The second charge/discharge element 370 can include a second switch SW3B and a second capacitor C'2. The second switch SW3B can have a first terminal configured to receive the system reference voltage, and a second terminal coupled to the reference current generator 320. The second capacitor C'2 can have a first terminal coupled to the second terminal of the second switch SW3B, and a second terminal configured to receive the system ground voltage GND. Therefore, the second capacitor C'2 of the second charge/discharge element 370 can be discharged to the system reference voltage when the second switch SW3B is turned on, and the second capacitor C'2 of the second charge/discharge element 370 can be charged by a duplicated reference current $I_{ref'}$ generated by the reference current generator 320 from the system reference voltage when the second switch SW3B is turned off.

It is to be noted that the first capacitor C'1 and the second capacitor C'2 can have the substantially same capacitance.

The reference current generator 320 can be configured to generate the duplicated reference current $I_{ref'}$. The reference current generator 320 may share the similar structure of the reference current generator 220, but with fifth and sixth PMOSFETs P3E and P3F. The fifth PMOSFET P3E can have a first terminal configured to receive the system high voltage VDD, a second terminal configured to receive a reference current $I_{ref}$ and a control terminal coupled to the second terminal of the fifth PMOSFET P3E. The sixth PMOSFET P3F can have a first terminal configured to receive the system high voltage VDD, a second terminal coupled to the first terminal of the second capacitor C'2 for outputting the duplicated reference current $I_{ref'}$, and a control terminal coupled to the control terminal of the fifth PMOSFET P3E.

To be even more specific, the first voltage trigger circuit 330 may include a third switch SW3C, a second NMOSFET N3B, a third PMOSFET P3C, and a first inverter INV'1. The third switch SW3C can have a first terminal configured to receive the system high voltage VDD, and a second terminal. The second NMOSFET N3B can have a first terminal coupled to the second terminal of the third switch SW3C, a second terminal configured to receive the system ground voltage GND, and a control terminal coupled to the input terminal $IN_{330}$ of the first voltage trigger circuit 330. The third PMOSFET P3C can have a first terminal configured to receive the system high voltage VDD, a second terminal coupled to the control terminal of the second NMOSFET N3B, and a control terminal coupled to the first terminal of the second NMOSFET N3B. The first inverter INV'1 can have an input terminal coupled to the first terminal of the second NMOSFET N3B and an output terminal coupled to the output terminal $OUT_{330}$ of the first voltage trigger circuit 330 for outputting the data signal $V_{data}$.

The second voltage trigger circuit 340 may include a fourth switch SW3D, a third NMOSET N3C, a fourth PMOSFET P3D, and a second inverter INV2. The fourth switch SW3D can have a first terminal configured to receive the system high voltage VDD, and a second terminal. The third NMOSFET N3C can have a first terminal coupled to the second terminal of the fourth switch SW3D, a second terminal configured to receive the system ground voltage GND, and a control terminal coupled to the input terminal $IN_{340}$ of the second voltage trigger circuit 340. The fourth PMOSFET P3D can have a first terminal configured to receive the system high voltage VDD, a second terminal coupled to the control terminal of the third NMOSFET N3C, and a control terminal coupled to the first terminal of the third NMOSFET N3C. The second inverter INV'2 can have an input terminal coupled to the first terminal of the third NMOSFET N3C and an output terminal coupled to the output terminal $OUT_{340}$ of the second voltage trigger circuit 340 for outputting the hold control signal $V_{hold}$.

The data holder 350 may include a fifth switch SW3E, a third inverter INV'3 and a fourth inverter INV'4. The data holder 350 may have the same structure as the data holder 250 and can be coupled to the output terminal $OUT_{330}$ of the first voltage trigger circuit 330 and the output terminal $OUT_{340}$ of second the voltage trigger circuit 340. The data holder 350 can be configured to hold a voltage level of the data signal $V_{data}$ when the hold control signal $V_{hold}$ changes from a first voltage level to a second voltage level, for example, when the hold control signal $V_{hold}$ changes from the system ground voltage GND to the system high voltage VDD.

Figure 6:
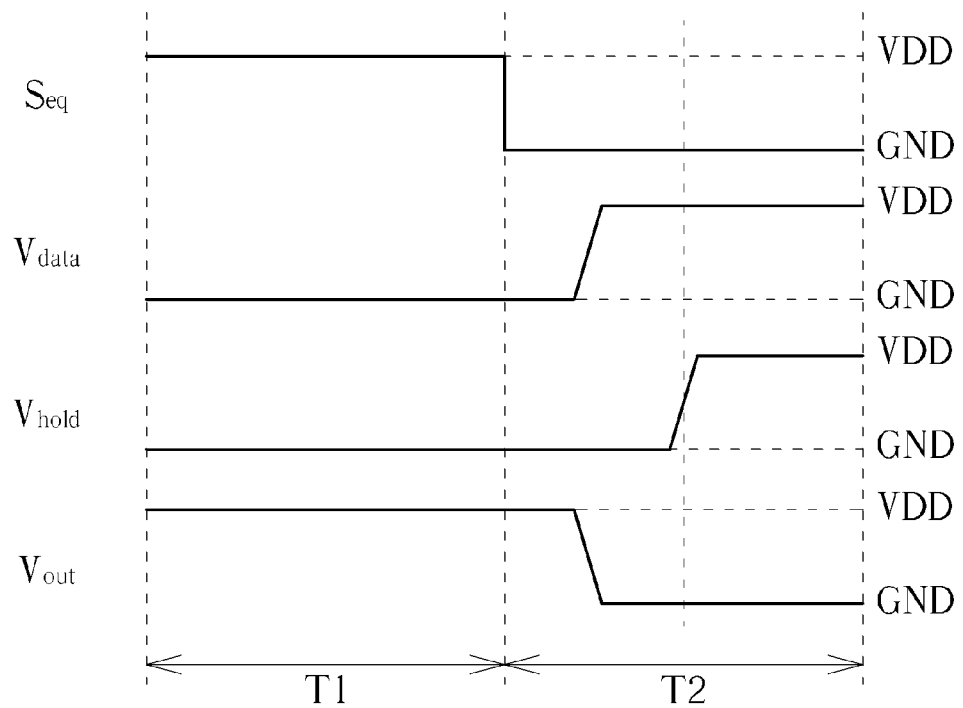
FIG. 6 shows a timing diagram for the sense amplifier in FIG. 5 according to one embodiment of the present invention.

FIG. 6 shows a timing diagram of the sense amplifier 300 sensing the bit data "0" according to one embodiment of the present invention. In FIG. 6, the switches SW3A, SW3B, SW3C, and SW3D are controlled by a signal $S_{eq}$. When the signal $S_{eq}$ is at a high voltage level, ex., the system high voltage VDD, the switches SW3A, SW3B, SW3C, and SW3D are turned on, and when the signal $S_{eq}$ is at a low voltage level, ex., the system ground voltage GND, the switches SW3A, SW3B, SW3C, and SW3D are turned off. However, the present invention is not limit to control the switches SW3A, SW3B, SW3C, and SW3D by the signal $S_{eq}$.

In FIG. 6, during the first period T1, the signal $S_{eq}$ is at the system high voltage VDD so the switches SW3A, SW3B, SW3C, and SW3D are turned on. The first and second capacitors C'1 and C'2 are discharged and the voltage levels of the first terminals of the capacitors C'1 and C'2 are pulled down to the system ground voltage GND. The fifth switch SW3E is also turned on during the first period T1. The second and third NMOSFETs N3B and N3C and the third and fourth PMOSFETs P3C and P3D are all turned off. The data signal $V_{data}$ is at the system ground voltage GND and the hold control signal $V_{hold}$ is also at the system ground voltage GND. Thus, the output signal $V_{out}$ of the sense amplifier 300, namely the voltage level of the output terminal of the third inverter INV'3 of the data holder 350, is at the system high voltage VDD.

During the second period T2, the signal $S_{eq}$ is at the system ground voltage GND so the switches SW3A, SW3B, SW3C, and SW3D are turned off. The first and second capacitors C'1 and C'2 are charged by the duplicated cell current $I_{cell'}$ and the duplicated reference current $I_{ref'}$ respectively. Thus, the voltage levels of the first terminals of the first and second capacitors C'1 and C'2 are pulled up simultaneously but with different speeds.

In FIG. 6, since the duplicated current $I_{cell'}$ is greater than the duplicated reference current $I_{ref'}$, the voltage level of the first terminal of the first capacitor C'1 is pulled up and reaches a turn-on voltage of the second NMOSFET N3B firstly, the second NMOSFET N3B will be turned on. The turned on second NMOSFET N3B will soon turn on the third PMOSFET P3C as well so the data signal $V_{data}$ will be changed to system high voltage VDD right after. Namely, when the fifth switch SW3E is turned on, the voltage level of the data signal $V_{data}$ is at the system high voltage VDD so that the output signal $V_{out}$ of the output terminal of the sense amplifier 300 is at the system ground voltage GND.

Thereafter, the voltage level of the first terminal of the second capacitor C'2 is pulled up and reaches a turn-on voltage of the third NMOSFET N3C, the third NMOSFET N3C will be turned on. The turned on third NMOSFET N3C will soon turn on the fourth PMOSFET P3D as well so the hold control signal $V_{hold}$ will be changed to system high voltage VDD right after. The fifth switch SW3E will be turned off when the hold control signal $V_{hold}$ changes from the system ground voltage GND to the system high voltage VDD. Namely, when the fifth switch SW3E is turned off, the voltage level of the data signal $V_{data}$ is latched by the data holder 350 as the system high voltage VDD so that the output signal $V_{out}$ of the sense amplifier 300 is latched at the system ground voltage GND.

It is to be noted that the turn-on voltage of the second NMOSFET N3B can be $V_{N3B\text{-}TH}$, where $V_{N3B\text{-}TH}$ denotes for the threshold voltage of the second NMOSFET N3B. And the turn-on voltage of the third NMOSFET N3C can be $V_{N3C\text{-}TH}$, where $V_{N3C\text{-}TH}$ denotes for the threshold voltage of the third NMOSFET N3C.

Figure 7:
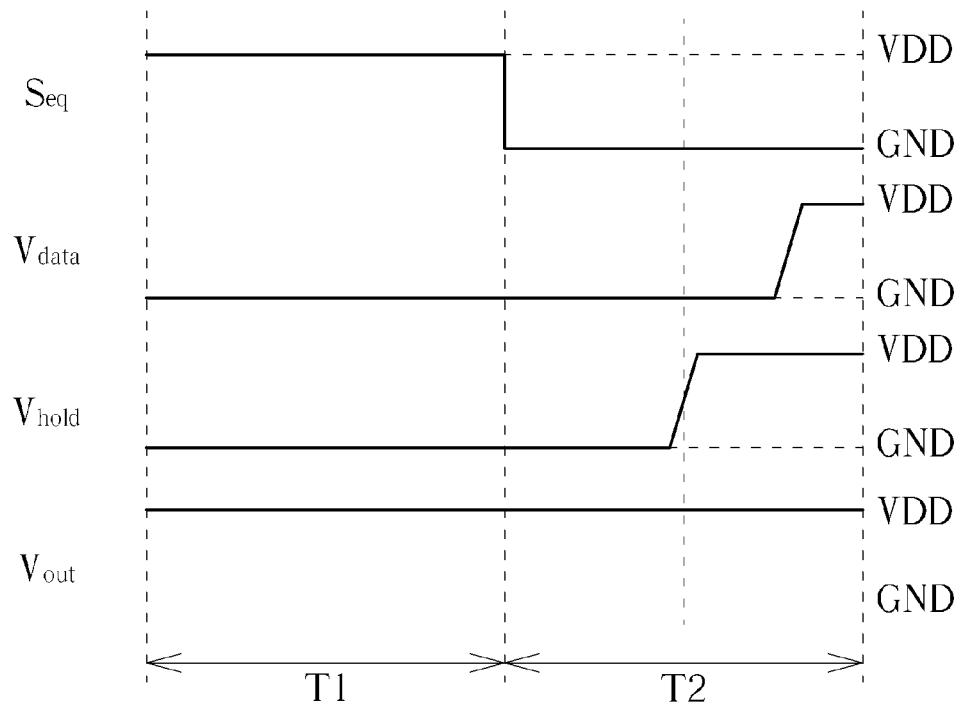
FIG. 7 shows a timing diagram for the sense amplifier in FIG. 5 according to another embodiment of the present invention.

FIG. 7 shows a timing diagram of the sense amplifier 300 sensing the bit data "1" according to another embodiment of the present invention. In FIG. 7 the same operations are applied to the sense amplifier 300 but the duplicated cell current $I_{cell'}$ is smaller than the duplicated reference current $I_{ref'}$, the hold control signal $V_{hold}$ will be changed to system high voltage VDD before the data signal $V_{data}$ is changed to the system high voltage VDD. Therefore, the voltage level of the data signal $V_{data}$ is latched by the data holder 350 as the system ground voltage GND before the data signal $V_{data}$ changes so the output signal $V_{out}$ of the sense amplifier 300 is latched at the system high voltage VDD.

In summary, the first switch SW3A and the second switch SW3B can be configured to be turned on during a first period T1 and be turned off during a second period T2. That is to say, when the first switch SW3A and the second switch SW3B are turned on during the first period T1, the first capacitor C'1 and the second capacitor C'2 are discharged to the system ground voltage GND. When the first switch SW3A and the second switch SW3B are turned off during the second period T2, the first capacitor C'1 and the second capacitor C'2 can be charged by the duplicated cell current $I_{cell'}$ and the duplicated reference current $I_{ref'}$ respectively. The first voltage trigger circuit 330 coupled to the first capacitor C'1 is triggered by a voltage level of the first capacitor C'1 for outputting a data signal $V_{data}$, while the second voltage trigger circuit 340 coupled to the second capacitor C'2 is triggered by a voltage level of the second capacitor C'2 for outputting a hold control signal $V_{hold}$. The data holder 350 can be coupled to the first voltage trigger circuit 330 and the second voltage trigger circuit 340 for outputting an output signal $V_{out}$ for indicating the bit data stored in the memory cell 30 according to the data signal $V_{data}$ latched and the hold control signal $V_{hold}$. In other words, since the duplicated cell current $I_{cell'}$ may be greater or smaller than the duplicated reference current $I_{ref'}$, the data signal $V_{data}$ may change from a first voltage level to a second voltage level before or after the hold control signal $V_{hold}$ change from the first voltage level to the second voltage level during the second period T2. The data holder 350 can output the output signal $V_{out}$ according to the data signal $V_{data}$ when the hold control signal $V_{hold}$ changes from the first voltage level to the second voltage level. Consequently, the state of the memory cell 30 can be determined according to the output signal $V_{out}$.

Consequently, the bit data stored in the memory cell 30 can be determined according to the output signal $V_{out}$ of the sense amplifier 300. Furthermore, the time required for determining the bit data of the memory cell 30 will mostly depend on the time for the duplicated cell current $I_{cell'}$ to charge the first capacitor C'1 to turn on the second NMOSFET N3B of the voltage trigger circuit 330, but independent from the differences between the cell current $I_{cell}$ and the reference current $I_{ref}$. In addition, by selecting proper a capacitor value for the first and second capacitors C'1 and C'2, the sense amplifier 300 can have an even faster sensing speed.

In summary, the sense amplifier according to the embodiments of the present invention is able to determine the bit data, which is independent from the differences between the cell current and the reference current. Also, by selecting the proper capacitor, the sense amplifier of the present invention can have an even faster sensing speed while preserving the correctness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sense amplifier, comprising:
   a cell current generator coupled to a memory cell, configured to receive a cell current outputted from the memory cell and configured to output a duplicated cell current accordingly;
   a reference current generator configured to generate a duplicated reference current;
   a first charge/discharge element coupled to the cell current generator, configured to receive a system ground voltage and a system reference voltage, to be charged to the system reference voltage, and to be discharged by the duplicated cell current from the system reference voltage;
   a second charge/discharge element coupled to the reference current generator, configured to receive the system ground voltage and the system reference voltage, to be charged to the system reference voltage, and to be discharged by the duplicated reference current from the system reference voltage;
   a first voltage trigger circuit having an input terminal coupled to the first charge/discharge element, and an output terminal for outputting a data signal;
   a second voltage trigger circuit having an input terminal coupled to the second charge/discharge element, and an output terminal for outputting a hold control signal; and
   a data holder coupled to the output terminal of the first voltage trigger circuit and the output terminal of the second voltage trigger circuit, and configured to latch a voltage level of the data signal when the hold control signal changes from a first voltage level to a second voltage level.

2. The sense amplifier of claim 1, wherein the memory cell comprises:
   a first PMOSFET (P-channel metal-oxide-semiconductor field-effect transistor) having a first terminal configured to receive a system high voltage, a second terminal, and a control terminal coupled to a word line; and
   a memory transistor having a first terminal coupled to the second terminal of the first PMOSFET, a floating gate terminal, and a second terminal coupled to the cell current generator.

3. The sense amplifier of claim 2, wherein:
   the first charge/discharge element comprises:
      a first switch having a first terminal configured to receive the system reference voltage, and a second terminal coupled to the cell current generator; and
      a first capacitor having a first terminal coupled to the second terminal of the first switch, and a second terminal configured to receive the system ground voltage;

the second charge/discharge element comprises:
  a second switch having a first terminal configured to receive the system reference voltage, and a second terminal coupled to the reference current generator; and
  a second capacitor having a first terminal coupled to the second terminal of the second switch, and a second terminal configured to receive the system ground voltage; and
the system reference voltage is higher than the system ground voltage.

4. The sense amplifier of claim 3, wherein:
the first switch and the second switch are turned on simultaneously and turned off simultaneously;
when the first switch and the second switch are turned on, the first capacitor and the second capacitor are charged to the system reference voltage; and
when the first switch and the second switch are turned off, the first capacitor is discharged by the duplicated cell current and the second capacitor is discharged by the duplicated reference current.

5. The sense amplifier of claim 4, wherein the cell current generator comprises:
  an amplifier having a positive terminal coupled to the memory transistor of the memory cell, a negative terminal configured to receive a bias voltage of the memory cell, and an output terminal;
  a first NMOSFET (N-channel metal-oxide-semiconductor field effect transistor) having a first terminal coupled to the positive terminal of the amplifier, a second terminal configured to receive the system ground voltage, and a control terminal coupled to the output terminal of the amplifier; and
  a second NMOSFET having a first terminal coupled to the first terminal of the first capacitor, a second terminal configured to receive the system ground voltage, and a control terminal coupled to the control terminal of the first NMOSFET.

6. The sense amplifier of claim 5, wherein the first voltage trigger circuit comprises:
  a third switch having a first terminal configured to receive the system ground voltage, and a second terminal;
  a second PMOSFET having a first terminal configured to receive the system high voltage, a second terminal coupled to the second terminal of the third switch, and a control terminal coupled to the input terminal of the first voltage trigger circuit;
  a third NMOSFET (N-channel metal-oxide-semiconductor field effect transistor) having a first terminal coupled to the control terminal of the second PMOSFET, a second terminal configured to receive the system ground voltage, and a control terminal coupled to the second terminal of the second PMOSFET; and
  a first inverter having an input terminal coupled to the second terminal of the second PMOSFET and an output terminal coupled to the output terminal of the first voltage trigger circuit;
wherein the first switch, the second switch and the third switch are turned on simultaneously and turned off simultaneously.

7. The sense amplifier of claim 6, wherein the second voltage trigger circuit comprises:
  a fourth switch having a first terminal configured to receive the system ground voltage, and a second terminal;
  a third PMOSFET having a first terminal configured to receive the system high voltage, a second terminal coupled to the second terminal of the fourth switch, and a control terminal coupled to the input terminal of the second voltage trigger circuit;
  a fourth NMOSFET (N-channel metal-oxide-semiconductor field effect transistor) having a first terminal coupled to the control terminal of the third PMOSFET, a second terminal configured to receive the system ground voltage, and a control terminal coupled to the second terminal of the third PMOSFET; and
  a second inverter having an input terminal coupled to the second terminal of the third PMOSFET and an output terminal coupled to the output terminal of the second voltage trigger circuit;
wherein the first switch, the second switch and the fourth switch are turned on simultaneously and turned off simultaneously.

8. The sense amplifier of claim 7, wherein the reference current generator comprises:
  a fifth NMOSFET (N-channel metal-oxide-semiconductor field effect transistor) having a first terminal configured to receive a reference current, a second terminal coupled to the system ground voltage, and a control terminal coupled to the first terminal of the fifth NMOSFET; and
  a sixth NMOSFET having a first terminal coupled to the first terminal of the second capacitor for outputting the duplicated reference current, a second terminal coupled to the system ground voltage, and a control terminal coupled to the first terminal of the fifth NMOSFET.

9. A sensing amplifier with a self-trigger latch, comprising:
  a cell current generator coupled to a memory cell, configured to receive a cell current outputted from the memory cell and configured to output a duplicated cell current accordingly;
  a reference current generator configured to generate a duplicated reference current;
  a first charge/discharge element coupled to the cell current generator and configured to receive a system ground voltage and a system reference voltage, to be charged to the system reference voltage during a first period, and to be discharged by the duplicated cell current from the system reference voltage during a second period;
  a second charge/discharge element coupled to the reference current generator and configured to receive the system ground voltage and the system reference voltage, to be charged to the system reference voltage during the first period, and to be discharged by the duplicated reference current from the system reference voltage during the second period;
  a first voltage trigger circuit coupled to the first charge/discharge element to be triggered by a voltage level of the first charge/discharge element for outputting a data signal during the second period;
  a second voltage trigger circuit coupled to the second charge/discharge element to be triggered by a voltage level of the second charge/discharge element for outputting a hold control signal during the second period; and
  a data holder coupled to the first voltage trigger circuit and the second voltage trigger circuit for outputting an output signal for indicating a bit data stored in the memory cell according to the data signal and the hold control signal;
wherein the first charge/discharge element and the second charge/discharge element have capacitors of substantially same capacitance.

10. The sensing amplifier of claim 9, wherein:
the system reference voltage is a system high voltage higher than the system ground voltage;

during the first period, the first charge/discharge element and the second charge/discharge element are charged to the system reference voltage; and during the second period, the first charge/discharge element is discharged by the duplicated cell current and the second charge/discharge element is discharged by the duplicated reference current.

11. The sensing amplifier of claim 9, wherein the data signal changes from a first voltage level to a second voltage level before or after the hold control signal changes from the first voltage level to the second voltage level during the second period.

12. The sensing amplifier of claim 9, wherein the data holder outputs the output signal according to the data signal when the hold control signal changes from a first voltage level to a second voltage level.

13. A sense amplifier, comprising:
a cell current generator coupled to a memory cell, configured to receive a cell current outputted from the memory cell and configured to output a duplicated cell current accordingly;
a reference current generator configured to generate a duplicated reference current;
a first charge/discharge element coupled to the cell current generator, configured to receive a system ground voltage and a system reference voltage, to be discharged to the system reference voltage, and to be charged by the duplicated cell current from the system reference voltage;
a second charge/discharge element coupled to the reference current generator, configured to receive the system ground voltage and the system reference voltage, to be discharged to the system reference voltage, and to be charged by the duplicated reference current from the system reference voltage;
a first voltage trigger circuit having an input terminal coupled to the first charge/discharge element, and an output terminal for outputting a data signal;
a second voltage trigger circuit having an input terminal coupled to the second charge/discharge element, and an output terminal for outputting a hold control signal; and
a data holder coupled to the output terminal of the first voltage trigger circuit and the output terminal of the second voltage trigger circuit, and configured to latch a voltage level of the data signal when the hold control signal changes from a first voltage level to a second voltage level.

14. The sense amplifier of claim 13, wherein the memory cell comprises:
a first NMOSFET (N-channel metal-oxide-semiconductor field effect transistor) having a first terminal, a second terminal configured to receive the system ground voltage, and a control terminal coupled to a word line; and
a memory transistor having a first terminal coupled to the cell current generator, a floating gate terminal, and a second terminal coupled to the first terminal of the first NMOSFET.

15. The sense amplifier of claim 14, wherein:
the first charge/discharge element comprises:
a first switch having a first terminal configured to receive the system reference voltage, and a second terminal coupled to the cell current generator; and
a first capacitor having a first terminal coupled to the second terminal of the first switch, and a second terminal configured to receive the system ground voltage;

the second charge/discharge element comprises:
a second switch having a first terminal configured to receive the system reference voltage, and a second terminal coupled to the reference current generator; and
a second capacitor having a first terminal coupled to the second terminal of the second switch, and a second terminal configured to receive the system ground voltage; and
the system reference voltage is equal to the system ground voltage.

16. The sense amplifier of claim 15, wherein:
the first switch and the second switch are turned on simultaneously and turned off simultaneously;
when the first switch and the second switch are turned on, the first capacitor and the second capacitor are discharged to the system reference voltage; and
when the first switch and the second switch are turned off, the first capacitor is charged by the duplicated cell current and the second capacitor is charged by the duplicated reference current.

17. The sense amplifier of claim 16, wherein the cell current generator comprises:
an amplifier having a positive terminal coupled to the memory transistor of the memory cell, a negative terminal configured to receive a bias voltage of the memory cell, and an output terminal;
a first PMOSFET (P-channel metal-oxide-semiconductor field effect transistor) having a first terminal configured to receive a system high voltage, a second terminal coupled to the positive terminal of the amplifier, and a control terminal coupled to the output terminal of the amplifier; and
a second PMOSFET having a first terminal configured to receive the system high voltage, a second terminal coupled to the first terminal of the first capacitor, and a control terminal coupled to the control terminal of the first PMOSFET.

18. The sense amplifier of claim 17, wherein the first voltage trigger circuit comprises:
a third switch having a first terminal configured to receive the system high voltage, and a second terminal;
a second NMOSFET having a first terminal coupled to the second terminal of the third switch, a second terminal configured to receive the system ground voltage, and a control terminal coupled to the input terminal of the first voltage trigger circuit;
a third PMOSFET (P-channel metal-oxide-semiconductor field effect transistor) having a first terminal configured to receive the system high voltage, a second terminal coupled to the control terminal of the second NMOSFET, and a control terminal coupled to the first terminal of the second NMOSFET; and
a first inverter having an input terminal coupled to the first terminal of the second NMOSFET and an output terminal coupled to the output terminal of the first voltage trigger circuit;
wherein the first switch, the second switch and the third switch are turned on simultaneously and turned off simultaneously.

19. The sense amplifier of claim 18, wherein the second voltage trigger circuit comprises:
a fourth switch having a first terminal configured to receive the system high voltage, and a second terminal;
a third NMOSFET having a first terminal coupled to the second terminal of the fourth switch, a second terminal configured to receive the system ground voltage, and a control terminal coupled to the input terminal of the second voltage trigger circuit;

a fourth PMOSFET (P-channel metal-oxide-semiconductor field effect transistor) having a first terminal configured to receive the system high voltage, a second terminal coupled to the control terminal of the third NMOSFET, and a control terminal coupled to the first terminal of the third NMOSFET; and a second inverter having an input terminal coupled to the first terminal of the third NMOSFET and an output terminal coupled to the output terminal of the second voltage trigger circuit;

wherein the first switch, the second switch and the fourth switch are turned on simultaneously and turned off simultaneously.

20. The sense amplifier of claim 19, wherein the reference current generator comprises:

a fifth PMOSFET (P-channel metal-oxide-semiconductor field effect transistor) having a first terminal coupled to the system high voltage, a second terminal configured to receive a reference current, and a control terminal coupled to the second terminal of the fifth PMOSFET; and a sixth PMOSFET having a first terminal coupled to the system high voltage, a second terminal coupled to the first terminal of the second capacitor for outputting the duplicated reference current, and a control terminal coupled to the control terminal of the fifth PMOSFET.

21. The sense amplifier of claim 20, wherein the data holder comprises:

a fifth switch having a first terminal coupled to the output terminal of the first voltage trigger circuit, a second terminal, and a control terminal coupled to the output terminal of the second voltage trigger circuit, the fifth switch being turned on when the first charge/discharge element and the second charge/discharge element are discharged to the system reference voltage, and turned off when the hold control signal changes from the first voltage level to the second voltage level;

a third inverter having an input terminal coupled to the second terminal of the fifth switch, and an output terminal; and a fourth inverter having an input terminal coupled to the output terminal of the third inverter, and an output terminal coupled to the input terminal of the third inverter.

22. A sensing amplifier with a self-trigger latch, comprising:

a cell current generator coupled to a memory cell, configured to receive a cell current outputted from the memory cell and configured to output a duplicated cell current accordingly;

a reference current generator configured to generate a duplicated reference current;

a first charge/discharge element coupled to the cell current generator and configured to receive a system ground voltage and a system reference voltage, to be discharged to the system reference voltage during a first period, and to be charged by the duplicated cell current from the system reference voltage during a second period;

a second charge/discharge element coupled to the reference current generator and configured to receive the system ground voltage and the system reference voltage, to be discharged to the system reference voltage during the first period, and to be charged by the duplicated reference current from the system reference voltage during the second period;

a first voltage trigger circuit coupled to the first charge/discharge element to be triggered by a voltage level of the first charge/discharge element for outputting a data signal during the second period;

a second voltage trigger circuit coupled to the second charge/discharge element to be triggered by a voltage level of the second charge/discharge element for outputting a hold control signal during the second period; and a data holder coupled to the first voltage trigger circuit and the second voltage trigger circuit for outputting an output signal for indicating a bit data stored in the memory cell according to the data signal and the hold control signal;

wherein the first charge/discharge element and the second charge/discharge element have capacitors of substantially same capacitance.

23. The sensing amplifier of claim 22, wherein:

the system reference voltage is substantially equal to the system ground voltage;

during the first period, the first charge/discharge element and the second charge/discharge element are discharged to the system reference voltage; and during the second period, the first charge/discharge element is charged by the duplicated cell current and the second charge/discharge element is charged by the duplicated reference current.

24. The sensing amplifier of claim 22, wherein the data signal changes from a first voltage level to a second voltage level before or after the hold control signal changes from the first voltage level to the second voltage level during the second period.

25. The sensing amplifier of claim 22, wherein the data holder outputs the output signal according to the data signal when the hold control signal changes from a first voltage level to a second voltage level.

* * * * *